(12) United States Patent
Guo et al.

(10) Patent No.: US 8,901,626 B2
(45) Date of Patent: Dec. 2, 2014

(54) SELF-ALIGNED CONTACTS FOR FIELD EFFECT TRANSISTOR DEVICES

(75) Inventors: Dechao Guo, Wappingers Falls, NY (US); Wilfried E. Haensch, Somers, NY (US); Xinhui Wang, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 13/554,305

(22) Filed: Jul. 20, 2012

(65) Prior Publication Data

US 2012/0280322 A1    Nov. 8, 2012

Related U.S. Application Data

(62) Division of application No. 12/757,201, filed on Apr. 9, 2010, now Pat. No. 8,367,508.

(51) Int. Cl.
  *H01L 29/76* (2006.01)
  *H01L 21/285* (2006.01)
  *H01L 29/66* (2006.01)
  *H01L 21/768* (2006.01)
  *H01L 21/28* (2006.01)
  *H01L 21/78* (2006.01)

(52) U.S. Cl.
  CPC ........ H01L 29/665 (2013.01); H01L 21/28525 (2013.01); *H01L 21/28114* (2013.01); *H01L 21/78* (2013.01); *H01L 29/66545* (2013.01); H01L 21/28088 (2013.01); H01L 21/76897 (2013.01)

USPC ............ 257/288; 257/576; 257/581; 257/583

(58) Field of Classification Search
  CPC ............ H01L 29/665; H01L 21/76897; H01L 29/6656; H01L 29/66439; H01L 29/66545
  USPC .................................. 257/288, 576, 581, 583
  See application file for complete search history.

(56) References Cited

U.S. PATENT DOCUMENTS

| | | | |
|---|---|---|---|
| 5,895,961 | A | 4/1999 | Chen |
| 6,207,543 | B1 | 3/2001 | Harvey |
| 6,403,485 | B1 | 6/2002 | Quek |
| 6,503,833 | B1 | 1/2003 | Ajmera |
| 6,518,151 | B1 | 2/2003 | Dobuzinsky |
| 6,627,502 | B1 | 9/2003 | Cho |
| 6,800,530 | B2 | 10/2004 | Lee et al. |
| 6,987,050 | B2 | 1/2006 | Cabral |

(Continued)

OTHER PUBLICATIONS

Deutsches, Patent-und Markenamt; 11 2011 100 421.4; German OA, Date Mailed; Jan. 31, 2013; pp. 1-10.

(Continued)

*Primary Examiner* — Long K Tran
(74) *Attorney, Agent, or Firm* — Cantor Colburn LLP; Vazken Alexanian

(57) ABSTRACT

A field effect transistor device includes a gate stack disposed on a substrate a first contact portion disposed on a first distal end of the gate stack, a second contact portion disposed on a second distal end of the gate stack, the first contact portion disposed a distance (d) from the second contact portion, and a third contact portion having a width (w) disposed in a source region of the device, the distance (d) is greater than the width (w).

16 Claims, 5 Drawing Sheets

(56) References Cited

U.S. PATENT DOCUMENTS

| | | | |
|---|---|---|---|
| 7,582,567 B1 | 9/2009 | Syau | |
| 7,615,831 B2 | 11/2009 | Zhu | |
| 8,673,725 B2 * | 3/2014 | O'Meara et al. | 438/303 |
| 2005/0070082 A1 * | 3/2005 | Kammler et al. | 438/592 |
| 2006/0138552 A1 | 6/2006 | Brask et al. | |
| 2009/0134470 A1 | 5/2009 | Yang | |
| 2009/0203184 A1 | 8/2009 | Magnee | |
| 2009/0218640 A1 | 9/2009 | Hampp | |
| 2010/0038715 A1 | 2/2010 | Babich et al. | |
| 2011/0241128 A1 * | 10/2011 | O'Meara et al. | 257/408 |
| 2011/0272823 A1 | 11/2011 | Sanders et al. | |

OTHER PUBLICATIONS

Office Action—Non-Final for U.S. Appl. No. 12/757,201, filed Apr. 9, 2010; First Named Inventor: Dechao Guo; Mailing Date: May 24, 2012.

Office Action—Restriction/Election for U.S. Appl. No. 12/757,201, filed Apr. 9, 2010; First Named Inventor: Dechao Guo; Mailing Date: Mar. 16, 2010.

International Search Report, International Application No. PCT/US11/28464, International Filing Date: Mar. 15, 2011, Date of Mailing: Jul. 26, 2011.

International Search Report—Written Opinion; International Application No. PCT/US11/28464; International Filing Date: Mar. 15, 2011; Date of Mailing: Jul. 26, 2011.

Risch, L., "Pushing CMOS beyond the roadmap", Proceedings of ESSDERC, Grenoble France, 2005, (c) 2005 IEEE, downloaded on Nov. 23, 2009, pp. 63-68.

Wong, H.-S.P., "Beyond the conventional transitor", IBM J. Res. & Dev. vol. 46, No. 2/3, Mar./May 2002, (c) 2002 IBM, pp. 133-168.

* cited by examiner

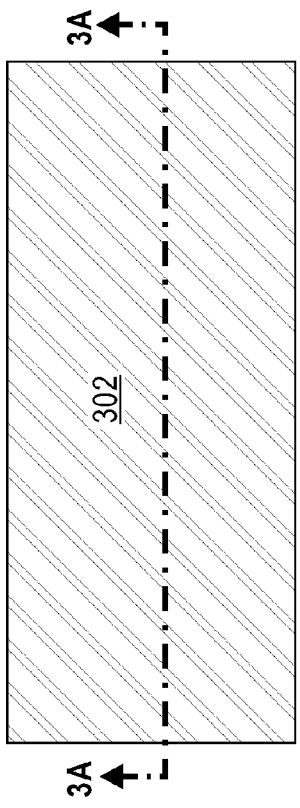
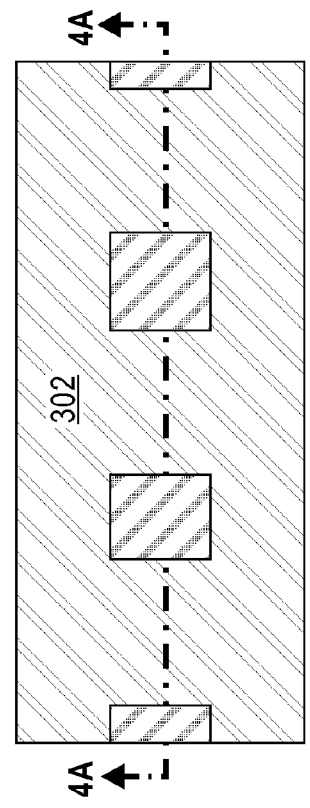
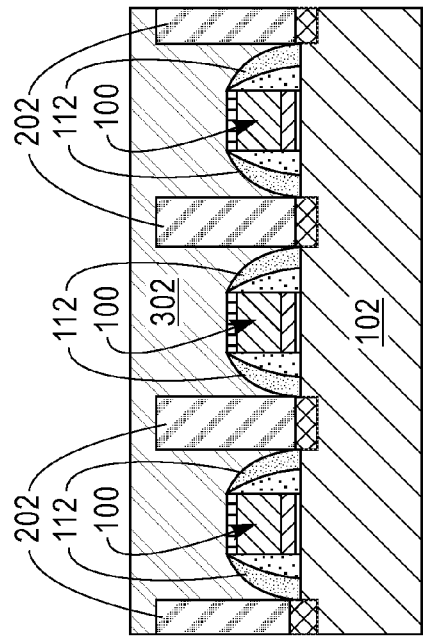
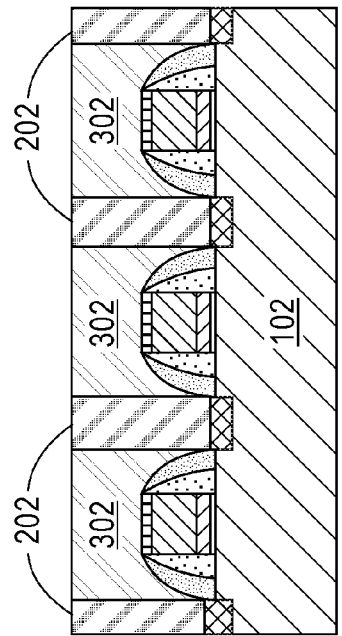
FIG. 3B
FIG. 4B
FIG. 3A
FIG. 4A

SELF-ALIGNED CONTACTS FOR FIELD EFFECT TRANSISTOR DEVICES

CROSS-REFERENCE TO RELATED APPLICATIONS

This is a divisional application of application Ser. No. 12/757,201, filed Apr. 9, 2010, now U.S. Pat. No. 8,367,508, which is incorporated by reference herein.

FIELD OF INVENTION

The present invention relates to semiconductor field effect transistors.

DESCRIPTION OF RELATED ART

Semiconductor field effect transistors (FETs) include source, drain, and gate regions that are often electrically connected to metallic contacts. The fabrication of the metallic contacts may cause a short between the contacts, if the metallic contacts are misaligned in the fabrication process.

BRIEF SUMMARY

In one aspect of the present invention, a field effect transistor device includes a gate stack disposed on a substrate a first contact portion disposed on a first distal end of the gate stack, a second contact portion disposed on a second distal end of the gate stack, the first contact portion disposed a distance (d) from the second contact portion, and a third contact portion having a width (w) disposed in a source region of the device, the distance (d) is greater than the width (w).

In another aspect of the present invention, a field effect transistor device includes a gate stack disposed on a substrate a first contact portion disposed on a first distal end of the gate stack, a second contact portion disposed on a second distal end of the gate stack, the first contact portion disposed a distance (d) from the second contact portion, a third contact portion having a width (w) disposed in a source region of the device, the distance (d) is greater than the width (w), and a fourth contact portion having a width (w) disposed in a drain region of the device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8C illustrate a method and resultant structure for forming a field effect transistor device.

DETAILED DESCRIPTION

Figure 1B:
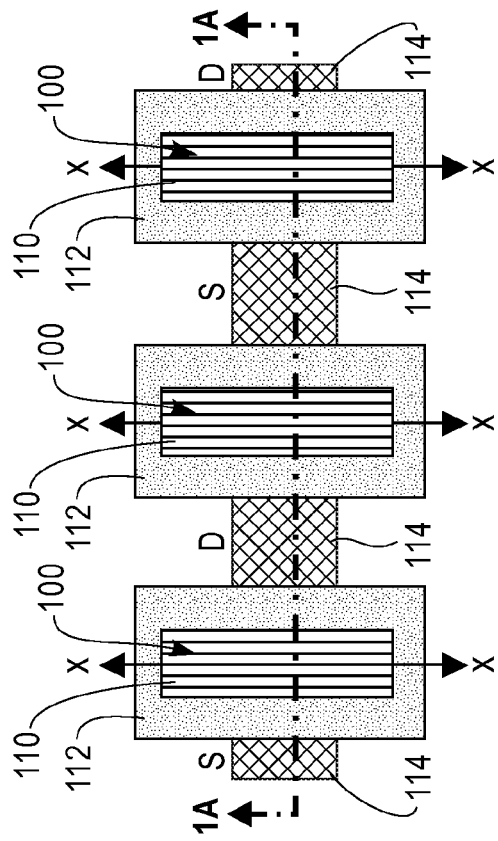
Figure 1A:
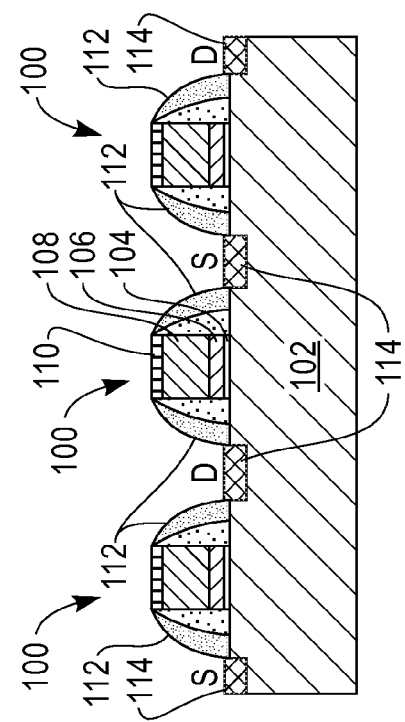

FIGS. 1A and 1B illustrate a cut-away and top-down view respectively of a method for forming a FET. FIG. 1A illustrates a plurality of gate stacks 100 disposed on a silicon substrate 102 that may include a silicon portion and a silicon-on-insulator trench portion (SOI) 501 (shown in FIG. 5A described below). The gate stacks 100 are arranged parallel having longitudinal axis x (shown in FIG. 1B). In the illustrated embodiment, the gate stack 100 includes a dielectric layer 104, such as, for example, a High-K dielectric material disposed on the substrate 102. A metal layer 106 such as, for example, TaN is disposed on the dielectric layer 104. A silicon layer 108 is disposed on the metal layer 106, and a hardmask layer 110 such as, for example, a SiN material is disposed on the silicon layer 108. A spacer 112 is formed on the substrate 102 along the sides of the gate stack 100. The spacer 112 may be formed from, for example, nitride materials, and may include any number of layers, and combinations of materials in the layers. In the illustrated embodiment, the spacer 112 includes two layers of spacer materials. Source regions (S) and drain regions (D) are formed on the substrate 102 adjacent to the spacers 112. The source and drain regions include a silicide 114 material such as, for example, $WSi_2$ or $NiSi_2$ that is formed on the source and drain regions.

Figure 2B:
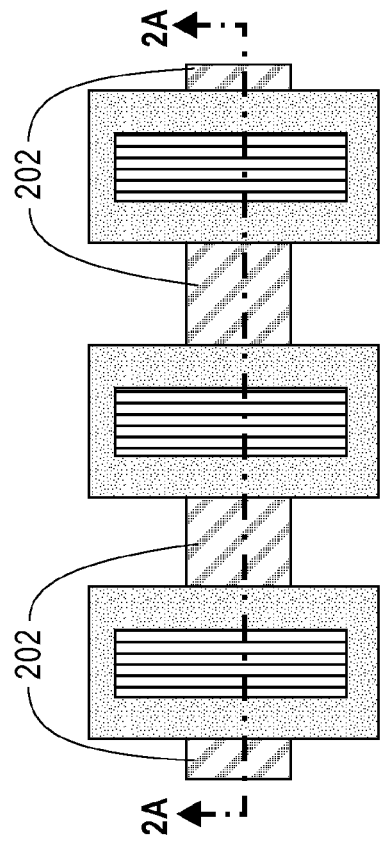
Figure 2A:
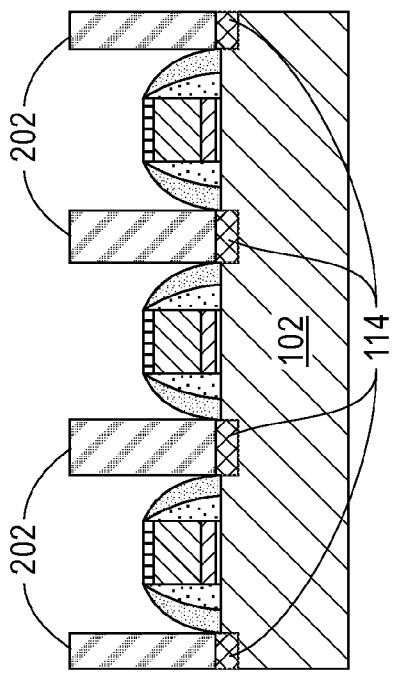

FIGS. 2A and 2B illustrate the resultant structure following the epitaxial growth of silicon on the exposed silicide 114 of the source and drain regions. The epitaxial growth results in exposed silicon regions 202 that extend from the silicide 114.

FIGS. 3A and 3B illustrate the resultant structure following the deposition of a liner layer 302 over the gate stack 100, the silicon regions 202, and the spacers 112. The liner layer 302 may include, for example, an oxide layer.

FIGS. 4A and 4B illustrate the resultant structure following the removal of a portion of the liner layer 302 to expose portions of the silicon regions 202. The portion of the liner layer 302 may be removed by, for example, a chemical mechanical polishing (CMP) process, or other suitable mechanical or chemical process.

Figure 5B:
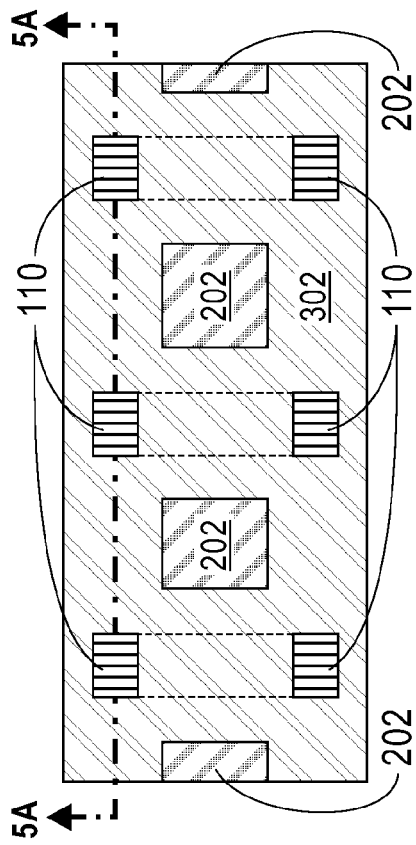
Figure 5A:
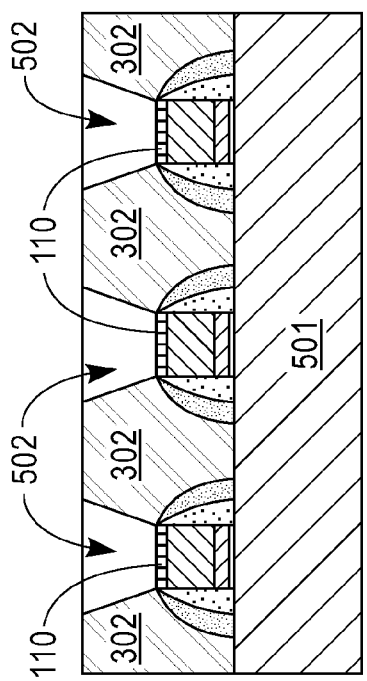

FIGS. 5A and 5B illustrate the resultant structure following the removal of portions of the liner layer 302 to expose portions of the hardmask layer 110. The removal of portions of the liner layer 302 form cavities 502 defined by the hardmask layer 110 and the liner layer 302.

Figure 6B:
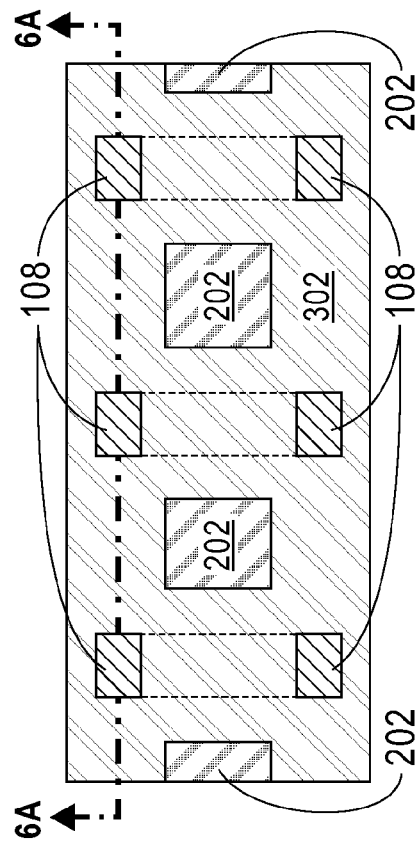
Figure 6A:
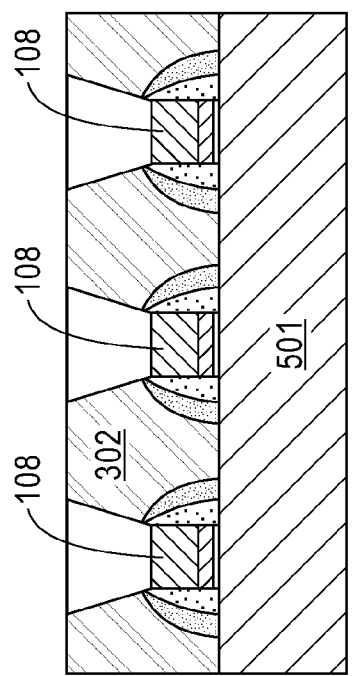

FIGS. 6A and 6B illustrate the resultant structure following the removal of the exposed portions of the hardmask layer 110, which exposes portions of the silicon layer 108. The exposed portions of the hardmask layer 110 may be removed by an etching process such as, for example, reactive ion etching (RIE) or another suitable etching process that is selective to etch the hardmask layer 110 material.

Figure 7B:
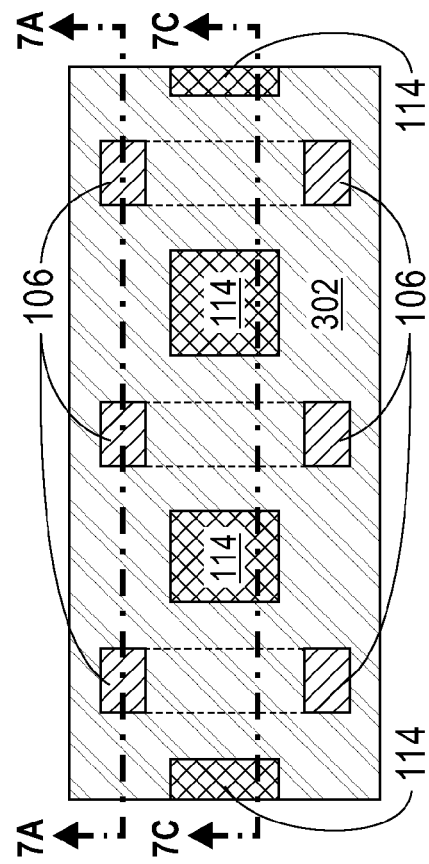
Figure 7A:
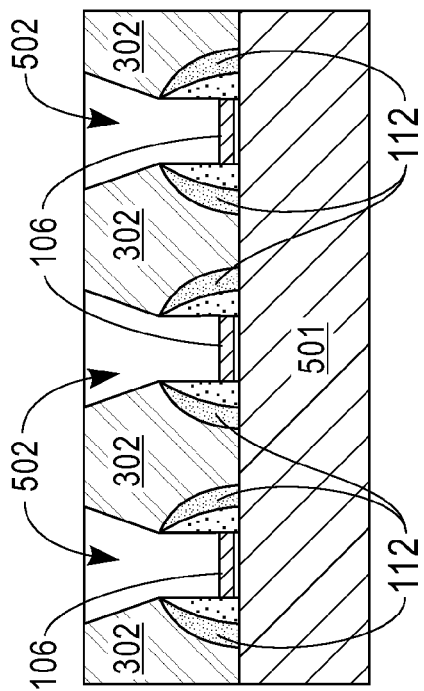
Figure 7C:
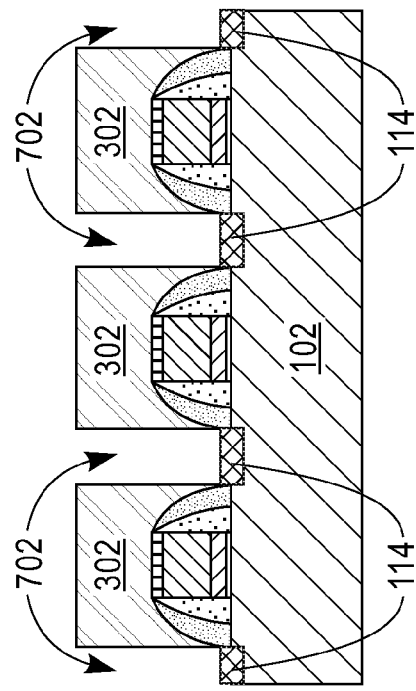

FIGS. 7A, 7B, and 7C illustrate the resultant structure following the removal of the exposed portions of the silicon layer 108 (of FIG. 6A), and the silicon regions 202 (of FIG. 6B). The exposed silicon may be removed by, for example, a RIE process that removes silicon or any other suitable etching process. The removal of the exposed portions of the silicon layer 108 exposes portions of the metal layer 106 and increases the depth of the cavities 502 such that the cavities 502 are defined by the liner layer 302, the spacers 112, and the metal layer 106, while the removal of the silicon regions 202 exposes the silicide 114 source and drain regions and forms cavities 702 in the liner layer 302. The cavities 702 are defined by the liner layer 302 and the silicide 114.

Figure 8B:
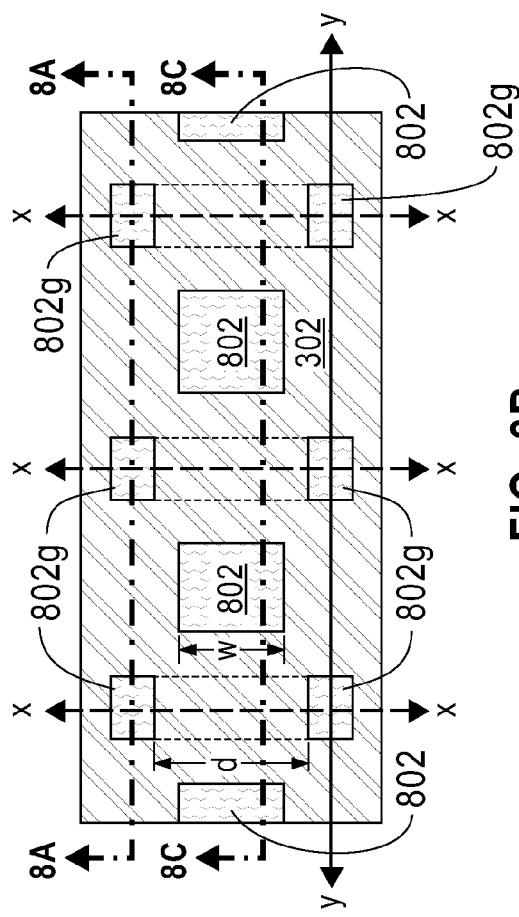
Figure 8A:
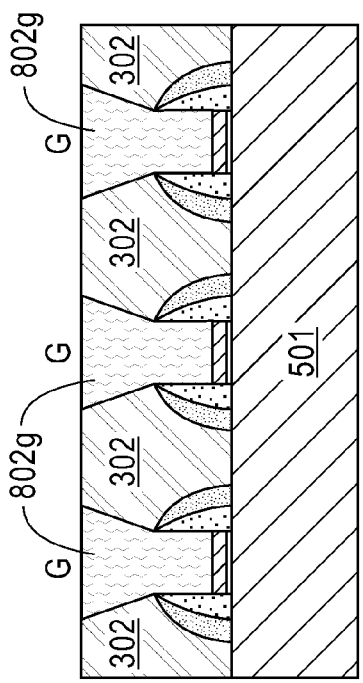
Figure 8C:
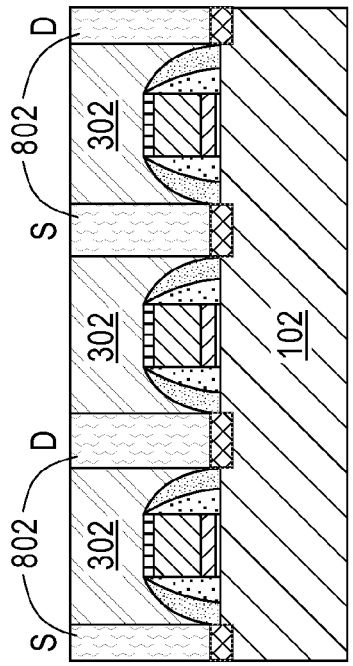

FIGS. 8A, 8B, and 8C illustrate the resultant structure following the formation of conductive contacts 802 and 802g in the cavities 502 and 707 (of FIGS. 7A and 7C). The conductive contacts 802 and 802g may be formed by depositing a layer of metal material such as, for example, silver, gold, or aluminum in the cavities 502 and 702, and over the exposed liner layer 302. A polishing process such as, for example CMP or another suitable process may be used to remove the metal material from the liner layer 302, and in some embodiments, a portion of the liner layer 302 to define the contacts 802 and 802g. The contacts 802 and 802g are electrically connected to the source, drain and gate (G) regions of the devices.

Referring to FIG. 8B, the source and drain region contacts 802 are arranged along the transverse axis shown by line 8C that is orthogonal to the longitudinal axis x of the gate stacks 100 (of FIG. 1B) the line 8C intersects the medial of the gate stacks 100. The gate region contacts 802g are arranged along the parallel axis shown by lines 8C and y that are orthogonal to the longitudinal axis of the gate stacks 100 and parallel to the longitudinal axis x. The gate region contacts 802g are spaced a distance (d) on distal ends of the gate stacks 100. The source and drain region contacts 802 have a width (w). In the illustrated embodiment, the distance d is greater than the width w. The offset of the gate region contacts 802g from the source and drain region contacts 802 reduces the occurrence of shorts between the contacts 802 and 802g in fabrication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
    a gate stack disposed on a substrate, the gate stack having a longitudinal axis parallel to a top surface of the substrate;
    a first conductive contact portion disposed at a first distal end of a top surface of the gate stack;
    a second conductive contact portion disposed at a second distal end of the top surface of the gate stack, the first conductive contact portion disposed a distance (d) from the second conductive contact portion, along the longitudinal axis; and
    a third conductive contact portion having a width (w) disposed on a source region adjacent a first side of the gate stack, the width (w) of the third conductive contact portion defined along a direction parallel to the longitudinal axis, wherein the distance (d) is greater than the width (w) of the third conductive contact portion, such that the first and second conductive contacts are spaced and offset from opposite ends of the third conductive contact along the direction parallel to the longitudinal axis.

2. The device of claim 1, wherein the first conductive contact portion and the second conductive contact portion contact a metal layer of the gate stack.

3. The device of claim 1, wherein the source region includes a silicide material.

4. The device of claim 1, wherein the gate stack includes a dielectric layer disposed on the substrate, a metal layer disposed on the dielectric layer, a silicon layer disposed on the metal layer, and a hardmask layer disposed on the silicon layer.

5. The device of claim 1, wherein the source region and the drain region are arranged on a silicon region of the substrate.

6. The device of claim 1, wherein the substrate includes a silicon region and a silicon-on-insulator trench region (SOI).

7. The device of claim 1, further including a spacer arranged adjacent to the gate stack, wherein the spacer includes a first nitride layer and a second nitride layer.

8. The device of claim 1, further including a spacer arranged adjacent to the gate stack, wherein the spacer includes first nitride material.

9. A field effect transistor device comprising:
    a gate stack disposed on a substrate, the gate stack having a longitudinal axis parallel to a top surface of the substrate;
    a first conductive contact portion disposed at a first distal end of a top surface of the gate stack;
    a second conductive contact portion disposed at a second distal end of the top surface of the gate stack, the first conductive contact portion disposed a distance (d) from the second conductive contact portion, along the longitudinal axis;
    a third conductive contact portion having a width (w) disposed on a source region adjacent a first side of the gate stack, the width (w) of the third conductive contact portion defined along a direction parallel to the longitudinal axis, wherein the distance (d) is greater than the width (w) of the third conductive contact portion, such that the first and second conductive contacts are spaced and offset from opposite ends of the third conductive contact along the direction parallel to the longitudinal axis; and
    a fourth conductive contact portion having a width (w) disposed on a drain region adjacent a second side of the gate stack, the width (w) of the fourth conductive contact portion defined along a direction parallel to the longitudinal axis, wherein the distance (d) is greater than the width (w) of the fourth conductive contact portion, such that the first and second conductive contacts are spaced and offset from opposite ends of the fourth conductive contact along the direction parallel to the longitudinal axis.

10. The device of claim 9, wherein the first conductive contact portion and the second conductive contact portion contact a metal layer of the gate stack.

11. The device of claim 9, wherein the source region and the drain region include a silicide material.

12. The device of claim 9, wherein the gate stack includes a dielectric layer disposed on the substrate, a metal layer disposed on the dielectric layer, a silicon layer disposed on the metal layer, and a hardmask layer disposed on the silicon layer.

13. The device of claim 9, wherein the source region and the drain region are arranged on a silicon region of the substrate.

14. The device of claim 9, wherein the substrate includes a silicon region and a silicon-on-insulator trench region (SOI).

15. The device of claim 9, further including a spacer arranged adjacent to the gate stack, wherein the spacer includes a first nitride layer and a second nitride layer.

16. The device of claim 9, further including a spacer arranged adjacent to the gate stack, wherein the spacer includes first nitride material.

* * * * *